United States Patent [19]

Solberg et al.

[11] Patent Number: 5,670,030
[45] Date of Patent: Sep. 23, 1997

[54] METHODS FOR PREPARING LOW SCATTER OPTICAL COATINGS

[75] Inventors: Scott Eugene Solberg; Richard Ian Seddon; Bradley James Pond; William Thomas Beauchamp, all of Santa Rosa, Calif.

[73] Assignee: Optical Coating Laboratory, Inc., Santa Rosa, Calif.

[21] Appl. No.: 617,678

[22] Filed: Mar. 19, 1996

[51] Int. Cl.[6] ............................................. C23C 14/34
[52] U.S. Cl. .............................. 204/192.26; 204/192.23; 204/192.27; 204/298.11
[58] Field of Search .................... 204/192.26, 192.27, 204/192.28, 192.29, 298.11, 192.23

[56] References Cited

U.S. PATENT DOCUMENTS

5,427,665  6/1995  Hartig et al. ..................... 204/192.12
5,507,931  4/1996  Yang ................................ 204/192.15

*Primary Examiner*—Aaron Weisstuch
*Attorney, Agent, or Firm*—Workman, Nydegger & Seeley

[57] ABSTRACT

The present invention is directed to a sputtering method for preparing optical coatings having low light scattering characteristics by controlling the angle of incidence of the material being sputtered without significantly reducing the coating efficiency of the sputtering process. The angle of incidence is controlled by reducing the collision scattering of the material being sputtered and by intercepting the sputtered material that would without interception arrive at the surface to be coated at high angles of incidence. The collision scattering is reduced by utilizing a sputtering gas that has a mass less than the mass of the material being sputtered.

18 Claims, 4 Drawing Sheets

METHODS FOR PREPARING LOW SCATTER OPTICAL COATINGS

BACKGROUND OF THE INVENTION

1. Field of the Invention

The present invention is directed to sputtering methods for preparing thick optical coatings having low light scattering characteristics. In particular, the present invention is directed to magnetron sputtering methods for preparing single and multiple layer optical coatings having low light scattering characteristics.

2. The Relevant Technology

Optical coatings are commonly used to reflect, refract, or filter differing wavelengths of light. Optical films are typically prepared by depositing a coating of material onto a suitable surface, such as a plastic or glass substrate. For optical coatings to properly function, it is vital that the deposited coating not adversely interfere with the optical characteristics desired. A problem commonly experienced with optical coatings is the undesirable scattering of light as it passes through optical coating layers. Light scattering (also hereinafter referred to as optical scattering) is the dispersal of wavelengths of light in a random manner caused by an inhomogeneity or defect in the optical coating. Scattering of light waves by optical films and coatings becomes undesirable when it interferes with the desired functioning of the film or coating. It is, therefore, desirable to minimize the occurrence of light scattering in optical coatings.

Sputtering techniques provide a highly efficient, cost-effective, low temperature method for depositing coatings on a wide range of substrates. However, thick optical coatings (optical coatings having thickness of at least 2 microns) formed using conventional sputtering techniques exhibit a disproportionate level of light scattering properties that interfere with the functioning of the optical coating. This disproportionate light scattering observed in sputter deposited coatings has precluded the practical use of sputtering techniques in the formation of thick optical coatings. Hence, there is a need for sputtering processes for preparing optical coatings having low light scattering characteristics.

A close examination of the surface of thick sputtered optical coatings shows a number of round bumps having near spherical contour. Further examination of cross-sections of multilayer optical coatings expose cone-shaped defects originating at inclusions in the coating or particulates at the substrate surface, and spherical shapes similar to those observed at the surface at layers within the coatings. In their paper entitled "Characterization of defect geometries in multilayer optical coatings,"*Laser-Induced Damage in Optical Materials*: 1993, Trench et at., postulated that these embedded defects (hereinafter referred to as "nodules") present in thick coatings are responsible for laser induced damage in coatings designed to reflect laser light. Trench et al., further predicted that if the arriving species have a wide angular distribution, the conic included angle of the nodule will be larger than if most of the arriving species have a more direct path to the surface being coated. Consequently, for a given coating thickness larger conic angles result in larger final nodule size.

Despite the postulation that the angle of coating species incidence is the major factor in nodule growth and consequently the light scattering characteristics of optical coatings deposited using sputtering techniques, no viable sputtering method has been proposed that adequately reduces the adverse effects of nodule growth at an economically acceptable coating efficiency. This being the case, there remains a need for a sputtering process that produces optical coatings having low light scattering characteristics, without sacrificing the advantages of sputtering processes.

SUMMARY AND OBJECTS OF THE INVENTION

It is, therefore, an object of the present invention to provide sputtering methods for economically and efficiently forming at least one layer of a thick optical coating having low light scattering characteristics.

It is another object of the present invention to provide sputtering methods for forming at least one layer of a thick optical coating having low densities of critical dimension nodules.

It is a further object of the present invention to provide sputtering methods wherein substantially all of the sputtered material arriving at the surface being coated has an acceptable angle of incidence to minimize nodule growth.

To achieve the foregoing objects, and in accordance with the invention as embodied and broadly described herein, the present invention is directed to a sputtering process utilizing a sputtering gas having a mass less than the mass of the material being sputtered, and intercepting the greatest portion of the material being sputtered which would without interception arrive at the surface to be coated at incidence angles greater than about 85° from normal. As used in this application, the term normal is defined as perpendicular to a chosen point on a surface.

In accordance with the present invention, and contrary to conventional knowledge, it has been discovered that by controlling the angle of incidence of the material being deposited by reducing the collision scattering of the sputtered material and by intercepting at least a major portion of the material being sputtered that would without interception arrive at the surface to be coated at incidence angles greater than about 85° from normal, optical coatings having low light scattering characteristics can be prepared, while maintaining high coating efficiencies. When the collision scattering and the angle of incidence of the sputter flux are controlled so that the angles of incidence of the majority of the sputter flux arriving at the surface being coated is below 85° from normal, optical coatings having a low density of critical dimension nodules are produced.

In a preferred embodiment of the present invention, optical films are prepared using a magnetron sputtering system with a neon sputtering gas and a silicon sputtering target. It has been discovered that by use of a sputtering gas (neon) that is lighter than the material being sputtered (silicon), the sputtered material is not significantly affected by collisions with the sputtering gas, thereby significantly diminishing the deflection of the sputtered silicon material. Since the sputtered material is not significantly affected by collisions with the sputtering gas, the sputtered material behaves similarly to an unscattered flux. When the deflections (also referred to as collision scattering) of the sputtered flux are significantly reduced, the angle of incidence can be controlled by using an appropriately placed mask to intercept that portion of the sputter flux that would arrive at the surface upon which a layer of said materials is to be formed at high angles of incidence.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to a specific embodiment thereof which is illustrated in the appended drawings. Understanding that these drawing depict only a typical embodiment of the invention and are not therefore to be considered to be limiting of its scope, the invention will be described and explained with additional specificity and detail through the use of the accompanying drawings in which:

FIG. 6 illustrates the sputtering process using a sputtering system having a mask 102 and a vertically cylindrical substrate surface to be coated. In addition, FIG. 6 illustrates the intercepting of a sputtered material having a high angle of incidence.

DETAILED DESCRIPTION OF THE PREFERRED EMBODIMENTS

The present invention is directed to sputtering methods for preparing thick optical coatings having low light scattering characteristics. In particular, the present invention is directed to sputtering methods for preparing single and multilayer optical coatings having low light scattering characteristics.

Currently, most high layer count optical coatings are prepared using evaporation techniques. However, evaporation techniques require the use of high temperatures and are not as cost-efficient as sputtering techniques. Unfortunately, thick optical coatings formed using conventional sputtering techniques exhibit light scattering characteristics that adversely affect the proper functioning of the optical coatings. It has been postulated that the increased light scattering in optical coatings is the result of defects, commonly referred to as nodules, formed within the optical coating during the sputtering process.

Although there has been much speculation as to the cause of the nodules, it is theorized in connection with the present invention that the nodules originate at microscopic defects or debris present on the surface of the substrate or in some cases deposited during the coating process itself by spitting or arcing processes. While nodules can originate at large or small particles it has now been discovered that most of the light scattering is caused by nodules originating at the substrate or underlying layer from particles too small to be readily detected by simple optical means. Although not directly observable, it is now believed from an analysis of the surface profiles of the coatings in connection with the present invention that the nodules may originate in defects of the order of one tenth of a micron or smaller in dimensions. Such defects could arise from airborne particles too small to be filtered out by even high quality cleanroom filters.

Figure 1A:
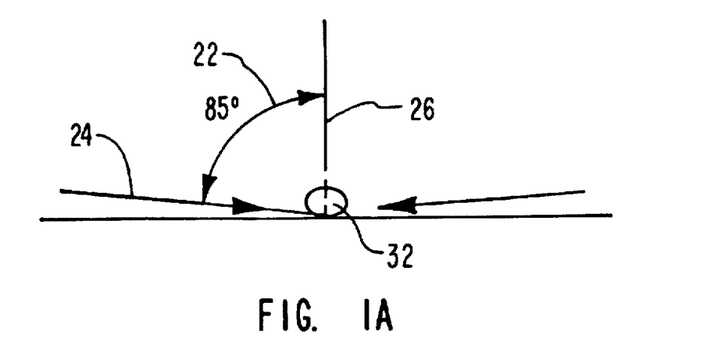
FIGS. 1a–1e illustrate the formation of a nodule by materials having high angles of incidence.
Figure 1B:
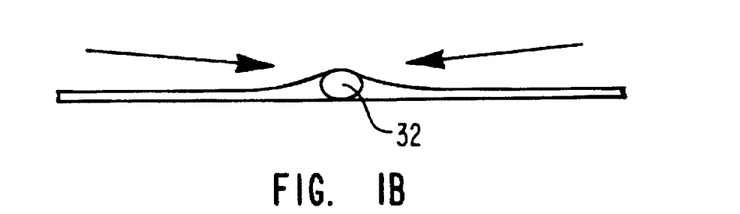
Figure 1C:
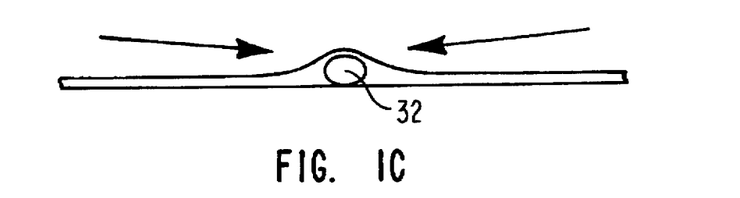
Figure 1D:
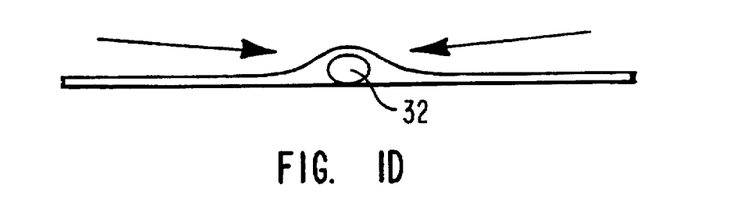
Figure 1E:
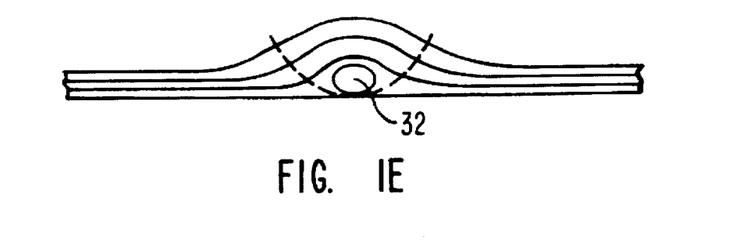
Figure 2:
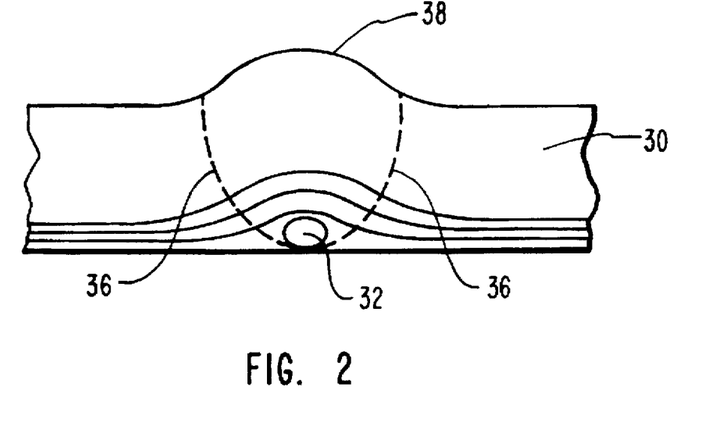
FIG. 2 is a cross-section of a nodule formed in an optical coating.

Nodules appear in many shapes and forms. FIG. 2 illustrates a cross-section of a representative nodule geometry having a parabolic shape terminating in a curved spherical cap 38. As shown in FIGS. 1a–1e and FIG. 2, a defect or microscopic debris 32 initiates a rippling effect as additional thickness of coating is deposited, magnifying the size and, consequently, the light scattering effect of the nodule. In addition, apparently since scattering occurs because of deformation of the interfaces between layers rather than in the bulk material within a layer, the light scattering effect tends to be magnified as the number of layers is increased.

Figure 3:
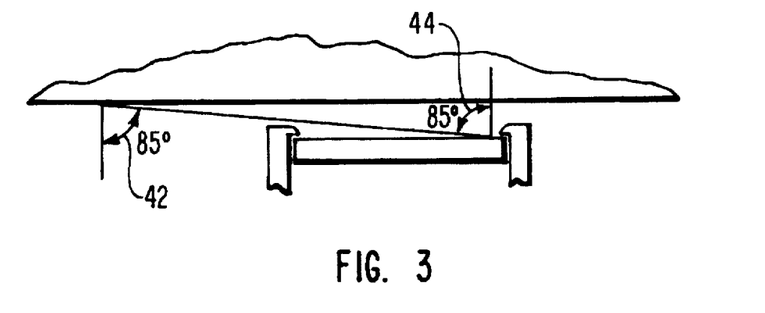
FIG. 3 illustrates the angle of incidence relative to the horizontal plane of a conventional planar magnetron sputtering system.

Referring to FIGS. 1a–1e, the nodule growth observed in optical coatings produced using sputtering techniques is the result of sputtered particles arriving at the surface upon which a layer of material is to be formed (hereinafter referred to as "surface" or "surface to be coated") at high angles of incidence 24. Material sputtered at high angles cause the nodules to grow laterally, resulting in the parabolic cross-section 36. One reason for these high angles of incidence in sputtering techniques is that the flux of materials sputtered inherently has a cosine distribution departing the target at a wide variety of angles. Without constraints, and in the absence of scattering collisions, the sputter flux (also referred to as "sputtered material") arrives at the surface at a wide variety of angles. For instance, as illustrated in FIG. 3, when the target and the surface are parallel, the angle of incidence 42 (depicted as 85° from normal) of unscattered flux in both the horizontal and the vertical planes are equivalent to the angle of the departing sputtered flux 44 (85° from normal). It is also believed that the amount of sputter flux having high angles of incidence tends to increase as the target erodes, effectively tilting the sputtering surface of the target, so that the target surface is no longer parallel with the surface being coated.

Figure 4:
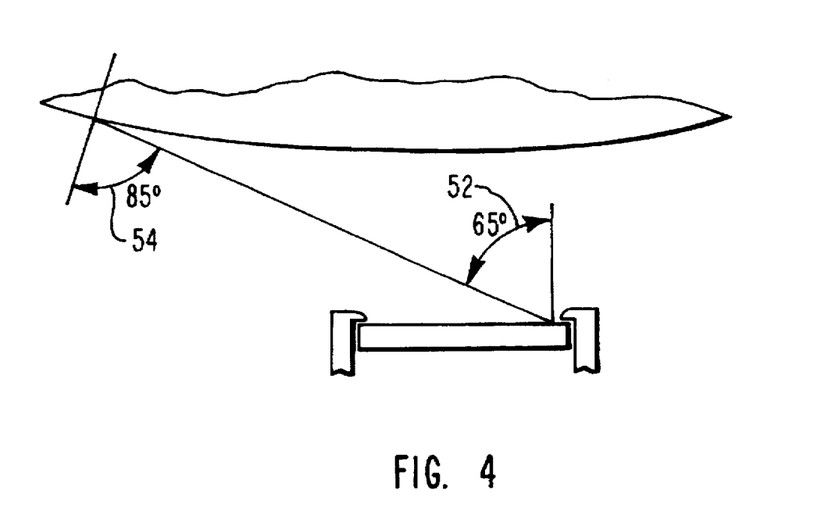
FIG. 4 illustrates the angle of incidence relative to the horizontal plane of a magnetron sputtering system having a cylindrical substrate or substrate carrier.

As illustrated in FIG. 4, another factor that can contribute to sputtered materials having high angles of incidence is the curvature of the surface upon which the layer is to be formed. In this example coating takes place on a cylindrical substrate carder with its axis vertical, and unscattered flux arriving at the surface to be coated at an 85° angle of incidence 54 from normal may leave the plane of the target at only a 65° angle 52 from normal. Of course, this effect is dependent on the curvature of the surface. Unless the surface is curved in a vertical fashion, an 85° angle of incidence at the surface corresponds to an 85° angle of departure from the target in the vertical plane.

Many attempts have been made to devise an economically viable sputter process for the formation of optical coating layers having few or no interfering nodules. For example, internal investigations by the assignee of this invention have been directed to the possibility that most light scattering was caused by sputtered material arriving at the surface being coated at high angles of incidence relative to normal. For example, referring to FIG. 1a, the sputtered particle 24 has an angle of incidence 22 of about 85° from normal 26. In an attempt to control the angle of incidence of the sputtered material, a waffle grid was used with a conventional magnetron sputtering system. The waffle grid restricted the sputtering flux passing through it to the portion of the sputtering flux having an angle less than 45° from normal. Although use of the waffle grid produced a coating having significantly reduced light scattering characteristics, use of the waffle grid resulted in unacceptable losses in coating efficiency, and thus proved not to be an economically feasible means for producing optical coatings. Subsequent attempts to limit the acceptance angles and, therefore, increase the coating efficiency, have also resulted in poor performance.

While mechanical means such as baffles can be effective in blocking unscattered flux, it has been determined as a feature of the present invention that they are much less effective in controlling flux which has undergone scattering collisions with the sputtering gas, since such flux can pass round the baffles and still reach the substrate at unacceptably high deposition angles. The number of scattering collisions the sputtering flux is subjected to in travelling from the sputtering target to the substrate is determined by the distance traversed, the pressure of the sputtering gas, and the sizes of the sputtered flux particles and the sputtering gas molecules or atoms. The extent to which each collision causes a change in direction depends on the ratio of the particle mass of the sputtering gas atom or molecule to the particle mass of the sputtering flux atom or molecule. As used in the present application, the term "particle mass" shall refer to the atomic or molecular mass of a material or gas. The number of collisions is proportional to the sum of the diameter of the sputtered particles and the sputtering gas atoms or molecules.

A typical magnetron sputtering system operates most efficiently at a sputtering gas pressure of 3–8 milliTorr, and has a target to substrate distance of more than 5 cm. (Average flux traversal distance is much more than this.) Under these conditions sputtering gas can be expected to undergo several collisions before reaching the target. It has been determined in connection with the present invention that it is important to use a sputtering gas which has a particle mass less than the particle mass of the sputtered material to minimize the effect of these collisions and permit effective use of baffles to control the angle of incidence of arriving species at the substrate.

It is a feature of the present invention to reduce the amount of sputtered material arriving at the surface being coated at high incidence angles in order to significantly reduce the rate of nodule growth in thick sputtered coatings.

In accordance with the present invention, it has been discovered that a sputtering process that intercepts sputtered materials having high angles of incidence combined with reduction of the collision scattering of the sputtered materials results in the formation of optical coatings having low light scattering characteristics while maintaining high coating efficiency.

Conventional sputtering processes typically utilize argon gas as a sputtering gas to sputter optical coating materials such as silicon. Because argon (particle mass 40) has a particle mass greater than the silicon materials being sputtered (particle mass 28), collisions between the argon and the silicon can have a substantial effect on the path of the sputtered silicon.

Figure 5:
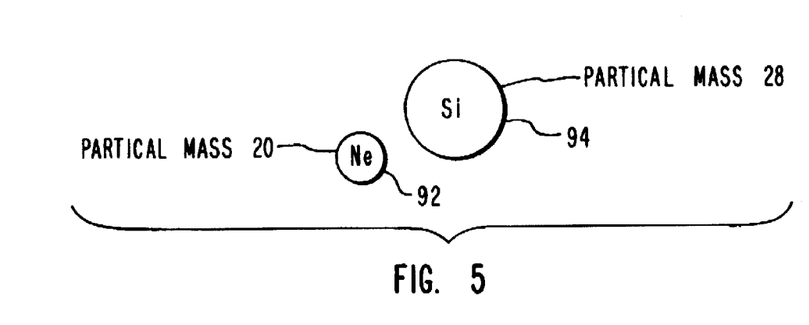
FIG. 5 illustrates the relative size difference of the neon sputtering gas and the silicon sputtering species in a preferred embodiment of the present invention.

It is a feature of the present invention to reduce the effect collision scattering has on the path taken by the sputtered material by utilizing a sputtering gas having a particle mass less, and preferably significantly less, than the particle mass of the target material being sputtered. For example, in a preferred embodiment of the present invention, neon (particle mass 20) is used as the sputtering gas and silicon (particle mass 28) is used as the target material sputtered. As illustrated in FIG. 5, collisions between neon 92 and silicon 94 will have little effect on the path of the sputtered silicon material. Reducing the collision scattering effect diminishes the deflection of the sputtered material and results in the sputtered material behaving similar to unscattered sputter flux.

Although unscattered, a portion of the sputtered material will still arrive at the surface being coated at high angles of incidence. This is because the sputtering of unscattered material inherently has a cosine distribution, wherein the sputtered material departs the target at a wide range of angles, and consequently arrives at the surface to be coated at a wide range of angles.

Figure 6:
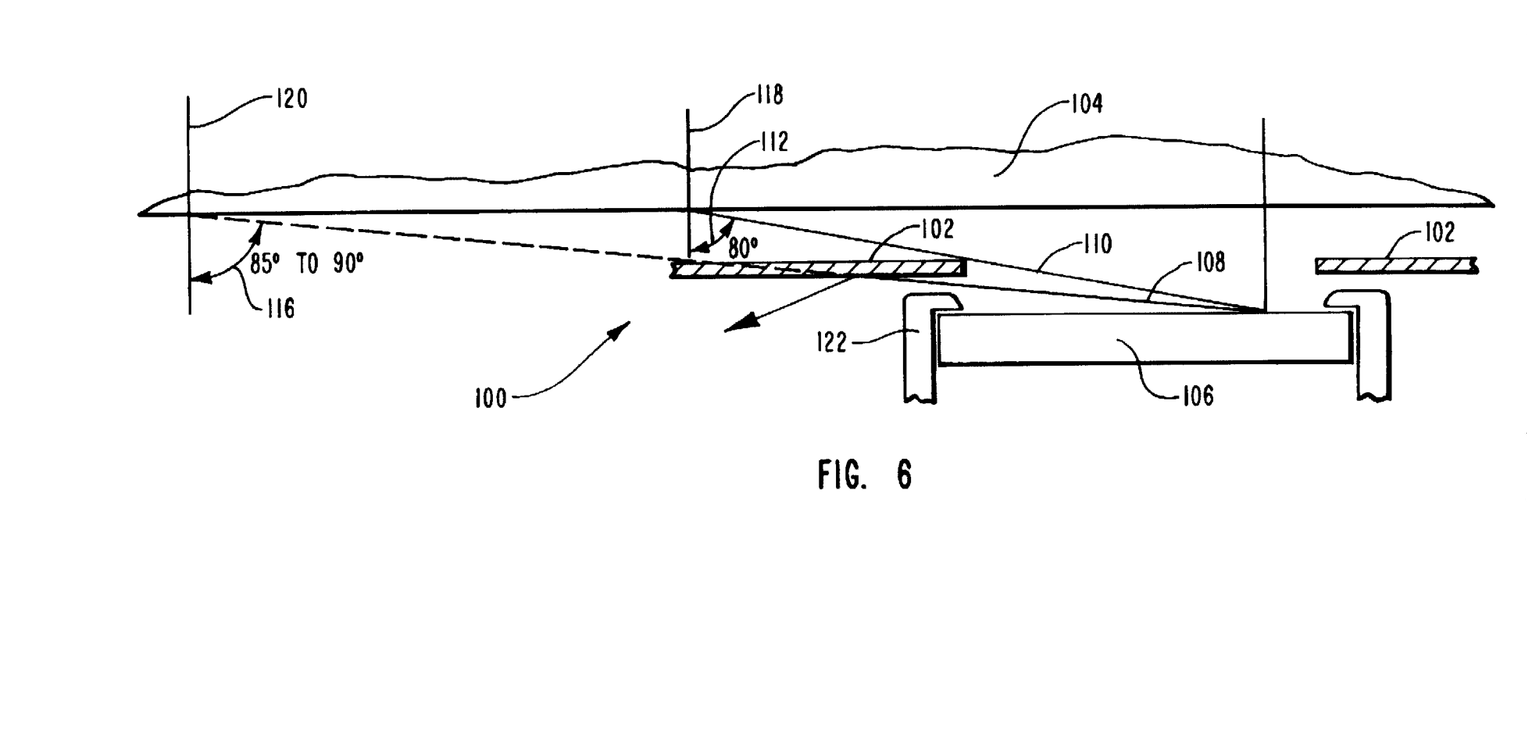

It is a feature of the present invention to intercept at least a major portion of any sputtered material being sputtered which without interception would arrive at the surface at angles greater than about 85° from normal. It has been determined that sputtered material arriving at the surface at angles greater than about 85° from normal contribute disproportionately to nodule growth. Interception can be accomplished by any means of intercepting the undesired sputter flux from the reaching the surface to be coated that does not unacceptably affect the coating efficiency. Referring to FIG. 6, a mask 102 is an example of a means for intercepting undesired sputter flux. It will be appreciated that other means of intercepting the undesired sputtered material include, but are not limited to appropriately placed grids, baffles and barriers. Furthermore, it is readily appreciated that the portion of the sputtered materials intercepted by the mask can be varied by changing the size of the mask opening or by varying the position of the mask with respect to the target 106. As illustrated in FIG. 6, the mask 102 is typically placed between the sputtered target and the surface.

Moreover, it will be appreciated that the present invention encompasses any sputtering process including: conventional DC sputtering processes, conventional RF sputtering processes, and magnetron sputtering processes. Conventional sputtering techniques provide a cost-effective, accurate deposition processes having high deposition rates. Furthermore, the deposition pressure and low substrate temperature requirements make sputtering a versatile process, especially for curved surfaces and low temperature substrates. A conventional sputtering system involves parallel plates, one plate being a target or cathode and the other being a substrate or anode. The surface upon which a layer of material is formed can be the substrate surface, the surface of the preceding layer, or any other surface capable of being coated. Additionally, as often used in magnetron sputtering systems, the substrate may be cylindrical.

In conventional sputtering techniques, a plasma is initiated in a sputtering gas, and ions from the plasma are accelerated towards a target by applying a negative voltage to it. The ions collide with the target surface and sputter off atoms of target material which traverse the plasma to the substrate. If the sputtering target is a metal and the sputtering gas is inert the film deposited will be a metal similar in composition to the target. If the sputtering gas contains controlled amounts of oxygen it is possible to form a film of an oxide of the metal which is appropriate for the manufacture of optical films. However, the sputtering rate for this "reactive" sputtering process is much slower than for sputtering of metallic films.

In a preferred embodiment of the present invention, optical coating layers are prepared using magnetron enhanced sputtering techniques. Magnetron sputtering systems use magnets to produce a tailored magnetic field near the target surface allowing for increased deposition rates and control of the erosion pattern of the target. Reactive processing can also be combined with magnetron sputtering but again the sputtering rate is substantially lower than for sputtering of metals.

In a more preferred embodiment of the present invention, optical coating layers are prepared using a magnetron sputtering system and process which are described in detail in commonly assigned U.S. Pat. Nos. 4,851,095 issued to Scobey et at. and 5,225,057 issued to LeFebvre et at., both of which are hereby incorporated by reference. The owner of these two patents, Optical Coating Laboratories, Inc. ("OCLI") manufacturers equipment which embodies the technology of these patents. OCLI uses its trademark "Meta-Mode" in connection with such equipment. The Meta-Mode® system allows for the formation of optical coating layers at high throughput and lower costs. Metal oxide coatings are deposited by sputtering many thin layers of the metal and reacting each layer before the next is deposited. The MetaMode® sputtering rate is high since the sputtering target is operated in the metal mode, and the film is subsequently reacted at a location remote from the target. The MetaMode process is particularly suitable for application of this invention since it permits the use of one gas for sputtering and a different one for reaction, with physical separation between the two. For instance, neon can be used in the sputtering region of the equipment and a reactive gas where it is needed for the reaction process. The reactive gas can be any suitable reactive gas, such as oxygen or nitrogen, or a mixture of oxygen and nitrogen.

As illustrated in FIG. 6 a MetaMode® system within the scope of the present invention comprises a deposition zone 100 having a surface upon which a layer can be formed 104, a target 106 composed of material to be sputtered, a mask 102 for intercepting undesirable portions of the sputter flux, and a baffle 122. The surface is typically located on a substrate holder or anode, which may be cylindrical. The target material, such as silicon, is sputtered using a low partical mass sputtering gas to deposit the silicon material such as neon. The silicon is subsequently reacted to form a silicon dioxide optical coating. As mentioned above, because the silicon sputter material has a greater particle mass than the neon sputtering gas, fewer significant deflections of the silicon from collisions are observed.

As illustrated by FIG. 6, a major portion of the silicon flux traveling at high angles of incidence is intercepted by mask 102, whereas the material traveling at an angle that will arrive at the surface to be coated at an angle of incidence less than about 85° from normal bypasses the mask 102. For example, 110 illustrates the path of an unscattered particle of silicon (or other sputtered material) having an 80° angle of incidence 112 from normal being sputter deposited on the surface to be coated. In contrast, the silicon particle having the path illustrated by 108 is intercepted by mask 102. As shown, the silicon particle 108 would, absent interception, arrive at the surface to be coated at an angle of incidence above 85° from normal. Once the surface has been coated with the silicon, the coated surface is reacted in a reaction zone using an ion gun source to form a silicon dioxide optical coating. It should be noted that any nodule growth is determined by the characteristics of the sputtering process, and is not significantly affected by any subsequent oxidation.

The surface upon which a layer of material is formed can be any suitable material to which an optical coating can be applied, including glass, plastic, films, or previously deposited coatings. Hence, a material may be deposited on a previously deposited optical coating layer or stack of optical coating layers. Multilayer optical coatings can be formed by the teachings of the present patent by forming layers of alternating high and low index of refraction materials.

The sputtering gas used in the present invention can be any suitable sputtering gas having a particle mass less, and preferably significantly less, than the target material being sputtered. Examples of suitable sputtering gases include argon, neon and helium.

The target material to be sputtered can be any material commonly used in the formation of optical coatings including materials having both high refractive indexes and low refractive indexes. It will be readily understood that depending on the sputtering method used, the target material can be a metal oxide or alternatively the metal can be reactively sputtered or the metal can be sputtered and subsequently exposed to a reactive gas to form the oxide or nitride of the metal. Therefore, depending on the sputtering process used and the optical coating desired, suitable target materials can include both the metal and their respective oxides or nitrides. For example, suitable low index target materials include silicon and aluminum. Since silicon and aluminum are relatively light the preferred sputtering gases would be composed mostly of light gases such as neon or helium. Likewise, suitable high index target materials include titanium, niobium, tantalium, zirconium, hafnium, tin, zinc and indium.

It is understood that many high index materials are massive enough to be used with argon as a sputtering gas, without being significantly affected by collisions with the sputtering gas. However, if a low mass target material, such as titanium is used for the high index layer, it is preferable to use a sputtering gas having a low particle mass, such as neon. It is still necessary to provide interception means for high angle of incidence particles.

It has been observed that more significant amount of optical scatter is observed as the physical thickness of the optical coating increases. For example, the addition of a second stack of a sputtered optical coating not utilizing this invention to a single stack coating resulted in very high scatter losses for small wavelengths of light, such as blue light, easily reaching values of 8% reflected and 8% transmitted light scatter at wavelengths for which electric fields are high. Light scatter at other blue wavelengths in the pass band typically exhibited at least half this value. A stack of layers is a series of alternating high and low index layers of similar optical thickness. As the physical thickness of the optical coating is increased, light scatter becomes significant for optical coatings with pass bands at longer wavelengths. It is believed that the increase in light scattering observed once a certain physical thickness is reached is because the nodule causing the optical scattering does not significantly scatter light until the nodule reaches what appears to be a critical dimension corresponding approximately to the wavelength of the light being scattered. This being the case, the present invention is particulary beneficial in reducing visible light scatter in single and multilayer optical coatings having a physical thickness of about 2 microns or greater. Ultraviolet light and other types of light having shorter wavelengths are scattered by thinner coatings.

Similarly, it has been observed that interfaces between the layers replicate the nodules in the coatings so that coatings with many thin layers may produce more scatter than coatings of similar total thickness but fewer layers.

EXAMPLES

The following examples illustrate the ability of the present invention to sputter deposit single and multiple layer optical coatings having low light scattering characteristics.

Example 1

The optical coatings described in the following example were formed using a MetaMode® sputtering system. A one inch wide by three quarter inch deep barrier was run the length of a silicon cathode target in the center of the race tracks. An additional side mask ensured that a major portion of the sputtered materials leaving the target at high angles would be intercepted. Using argon as a sputtering gas the light scatter was reduced by about 25% of its original value, but with a 30% loss in coating rate.

A second test using the same system as described above was conducted using neon as the sputtering gas. Use of neon resulted in an optical coating having a reduction of 90% in scattering.

Subsequent tests using neon as the sputtering gas showed that it was possible to eliminate the central barrier running the length of the silicon target and control the incidence angles with a suitably placed mask. The result of these tests were that optical coatings having acceptably low light scattering characteristics formed using a MetaMode® sputtering process exhibiting a loss in coating efficiency of less than 10%, which was later compensated for by increasing the sputtering power.

This example illustrates the use of a sputtering gas (neon) having a particle mass less the particle mass of the target material (silicon), combined with a mask to control the angle of incidence of the material arriving at the surface being coated, allows an optical coating having low light scattering characteristics to be formed with no significant loss in coating efficiency.

Example 2

Figure 7:
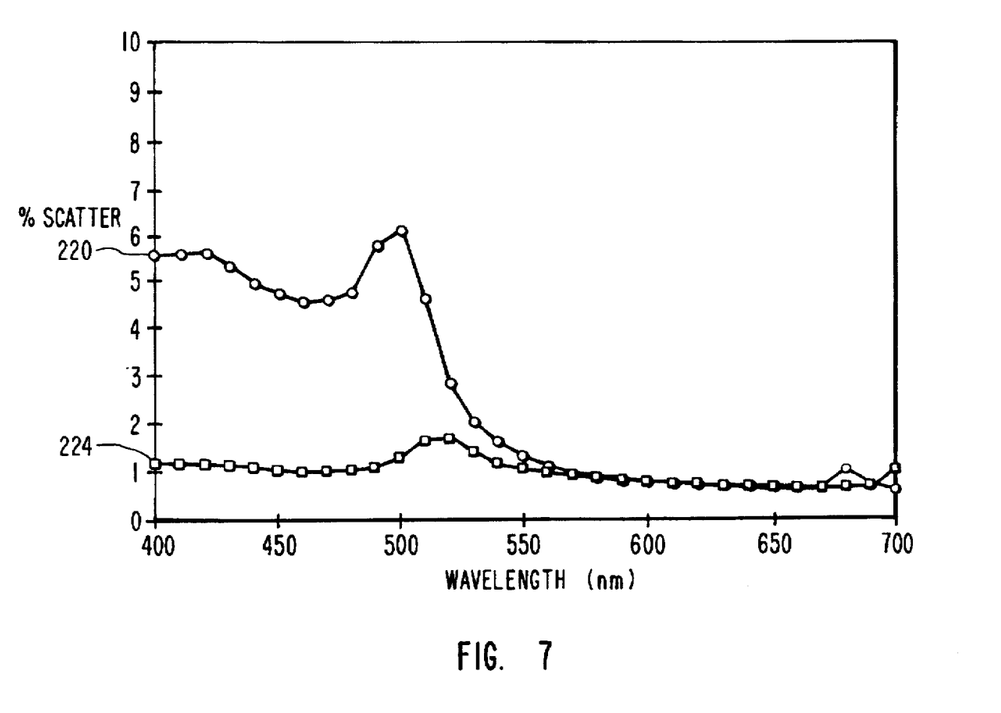
FIG. 7 illustrates percent scatter of a filter coated with a standard MetaMode® system compared with a filter of the same design coated using a sputtering gas with a particle mass less the sputtering target material, and a mask in accordance with teachings of the present invention.

FIG. 7 shows the results of a test in which a filter coated with a standard MetaMode® system was compared with a filter of the same design coated with a system modified in accordance with the teachings of this invention. The filter consisted of 34 alternating layers of niobia and silica, and had a total physical thickness of about 3 microns. It was designed to transmit wavelengths of less than 500 mm, and reflect longer visible wavelengths.

Test 1, represented by vector 220, used argon as the sputtering gas for both niobium and silicon, and masking similar to that shown in FIG. 6 was used at each cathode. However for this test the mask was not configured to intercept unscattered sputtered species arriving at the substrate at incidence angles greater than 85°.

In test 2, represented by vector 224, neon was used as the sputtering gas for silicon, and argon as the sputtering gas for niobium in accordance with the teachings of this invention for deposition onto a cylindrical substrate. Also the mask was reconfigured to ensure that unscattered sputtered species in the plane of the paper in FIG. 6 were intercepted.

Measurements were made of reflected scatter using a spectrophotometer configured to accept only non-specular reflected light. As illustrated in FIG. 7, the level of reflected scattered light was reduced by approximately a factor of five in the important transmission band for the filter. Other tests have shown similar results for transmitted scattered light.

In this example because of the cylindrical substrate configuration and the cosine distribution of emitted sputtered flux, it is more important to intercept unscattered flux arriving at more than 85° incidence in the plane of the paper (perpendicular to the substrate axis) in FIG. 6. However it is reasonable to expect that interception of components of this flux in the perpendicular direction would result in further reduction in scattered light.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A sputtering process for forming at least one layer of a thick optical coating having low scattering characteristics, said process comprising the steps of:
   providing a sputtering system comprising a sputtering gas, a target comprised of material to be sputtered, and a surface upon which a layer of said material is to be formed;
   said sputtering system utilizing a sputtering gas that has a particle mass less than the particle mass of said target material to be sputtered so as to diminish deflection of target material caused by collisions of sputtered target material with the sputtering gas;
   sputtering said target material toward said surface;
   intercepting at least a major portion of any material being sputtered which without interception would arrive at said surface at incidence angles greater than about 85° from normal whereby a layer of the target material having low scattering characteristics is deposited on said surface.

2. A sputtering process for preparing at least one layer of a thick optical coating having low scattering characteristics as recited in claim 1, wherein said sputtering gas is neon.

3. A sputtering process for preparing at least one layer of a thick optical coating having low scattering characteristics as recited in claim 1, wherein said sputtering system is a magnetron sputtering system and further comprising the step of reacting said layer of target material deposited on said surface with a reactive gas to form an optical layer.

4. A sputtering process for preparing at least one layer of a thick optical coating having low scattering characteristics as recited in claim 3, wherein said reactive gas is selected from the group consisting of oxygen, nitrogen and mixtures, thereof.

5. A sputtering process for preparing at least one layer of a thick optical coating having low scattering characteristics as recited in claim 1, wherein said target material being sputtered is silicon and said process further comprises the step of reacting said deposited layer of silicon with a reactive gas to form an optical layer.

6. A sputtering process for preparing at least one layer of a thick optical coating having low scattering characteristics as recited in claim 5, wherein said reactive gas is oxygen.

7. A sputtering process for preparing at least one layer of a thick optical coating having low scattering characteristics as recited in claim 5, wherein said sputtering system comprises a magnetron sputtering system having a deposition zone and a reaction zone, and wherein said process further comprises the step of reacting said deposited layer of silicon with oxygen or nitrogen, or a mixture of oxygen and nitrogen, to form an optical layer.

8. A sputtering process for preparing at least one layer of a thick optical coating having tow scattering characteristics as recited in claim 1, further comprising the formation of layers of alternating high and low index of refraction materials to form a multilayer optical coating.

9. A sputtering process for preparing at least one layer of a thick optical coating having low scattering characteristics as recited in claim 8, wherein said multilayer optical coating has an overall physical thickness of at least 2 microns.

10. A sputtering process for preparing at least one layer of a thick optical coating having low scattering characteristics as recited in claim 1, wherein said intercepting step is performed by a mask placed between the sputtered target and the surface.

11. A sputtering process for preparing at least one layer of a thick optical coating having low scattering characteristics as recited in claim 1, wherein said sputtering gas is selected from the group consisting of argon, neon, helium, and mixtures thereof.

12. A sputtering process for preparing at least one layer of a thick optical coating having low scattering characteristics as recited in claim 1, wherein said target material being sputtered is selected from the group consisting of silicon, aluminum, titanium, tin, zinc, niobium, tantalum, zirconium, hafnium, and indium.

13. A magnetron sputtering process for forming at least one layer of a thick optical coating having low scattering characteristics, said process comprising the steps of:

providing a magnetron sputtering system comprising a neon sputtering gas, a target comprised of silicon to be sputtered and a surface upon which a layer of silicon is to be formed;

sputtering said silicon toward said surface;

intercepting at least a major portion of any sputtered silicon which without interception would arrive at said surface at incidence angles greater than about 85° from normal whereby a layer of silicon having low scattering characteristics is deposited on said surface; and reacting said deposited layer of silicon with reactive gas, so that the silicon layer becomes an optical layer.

14. A magnetron sputtering process for forming at least one layer of a thick optical coating having low scattering characteristics as recited in claim 13, wherein said reactive gas is selected from the group consisting of oxygen, nitrogen, and mixtures thereof.

15. A magnetron sputtering process for forming at least one layer of a thick optical coating having low scattering characteristics as recited in claim 13, further comprising the formation of layers of alternating high and low index of refraction materials to form a multilayer optical coating.

16. A magnetron sputtering process for forming at least one layer of a thick optical coating having low scattering characteristics as recited in claim 15, wherein said multilayer optical coating has an overall physical thickness of at least 2 microns.

17. A magnetron sputtering process for forming at least one layer of a thick optical coating having low scattering characteristics as recited in claim 13, wherein said sputtering system is a magnetron sputtering system including at least one deposition zone and at least one reaction zone.

18. A magnetron sputtering process for forming at least one layer of a thick optical coating having low scattering characteristics as recited in claim 13, wherein said intercepting step is performed by a mask placed between the sputtered target and the surface.

* * * * *

UNITED STATES PATENT AND TRADEMARK OFFICE
CERTIFICATE OF CORRECTION

PATENT NO. : 5,670,030

DATED : September 23, 1997

INVENTOR(S) : Scott Eugene Solberg; Richard Ian Seddon;
Bradley James Pond; William Thomas Beauchamp It is certified that error appears in the above-identified patent and that said Letters Patent is hereby corrected as shown below:

Cover Page, References Cited, please add the following "Other Documents"

Tench et al, "Characterization of Defect Geometries in Multilayer Optical Coatings" in Laser-Induced Damage in Optical Materials: 1993.

Morelli, Dennis W., Interference Filter Handbook, Part One, Substrates and General Information, 1991, Optical Coating Laboratory, Inc., pgs. 25-28.

Rancourt, J.D., Optical Thin Films Users' Handbook, 1987, Optical Coating Laboratory, Inc., pgs. 13-15, 54-56, 151-152, 171-172.

Col. 9, line 37, after "500" change "mm" to --nm--

Col. 10, line 60, after "having" change "tow" to --low--

Signed and Sealed this

Thirtieth Day of June, 1998

Attest:

BRUCE LEHMAN

Attesting Officer

Commissioner of Patents and Trademarks